United States Patent
Adusumilli et al.

(10) Patent No.: US 9,876,075 B2
(45) Date of Patent: Jan. 23, 2018

(54) METHOD OF FORMING DIELECTRIC WITH AIR GAPS FOR USE IN SEMICONDUCTOR DEVICES

(71) Applicant: International Business Machines Corporation, Armonk, NY (US)

(72) Inventors: Praneet Adusumilli, Albany, NY (US); Alexander Reznicek, Troy, NY (US); Oscar Van der Straten, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/885,771

(22) Filed: Oct. 16, 2015

(65) Prior Publication Data

US 2017/0110361 A1    Apr. 20, 2017

(51) Int. Cl.
*H01L 21/31* (2006.01)
*H01L 29/06* (2006.01)
(Continued)

(52) U.S. Cl.
CPC .... *H01L 29/0649* (2013.01); *H01L 21/02164* (2013.01); *H01L 21/265* (2013.01);
(Continued)

(58) Field of Classification Search
CPC ... H01L 21/7682; H01L 21/31; H01L 21/265; H01L 21/02164; H01L 21/76802;
(Continued)

(56) References Cited

U.S. PATENT DOCUMENTS

| 5,955,749 A | 9/1999 | Joannopoulos et al. |
| 6,933,552 B1 | 8/2005 | Green et al. |

(Continued)

FOREIGN PATENT DOCUMENTS

CN    103178002 A    6/2013

OTHER PUBLICATIONS

O. Karthaus et al., "Water-Assisted Formation of Micrometer-Size Honeycomb Patterns of Polymer," Langmuir, Jul. 25, 2000, pp. 6071-6076, vol. 16, No. 15, American Chemical Society.

(Continued)

*Primary Examiner* — Bilkis Jahan
(74) *Attorney, Agent, or Firm* — Daniel P. Morris, Esq.; Otterstedt, Ellenbogen & Kammer, LLP (57) ABSTRACT

Aspects of the invention are directed to a method for forming a semiconductor device. A dielectric layer is formed on a semiconductor substrate. Subsequently, a metallic contact is formed in the dielectric layer such that it lands on the semiconductor substrate. A masking layer comprising a block copolymer is then formed on the dielectric layer. This block copolymer is caused to separate into two phases. One of the two phases is selectively removed to leave a patterned masking layer. The patterned masking layer is used to etch the dielectric layer. The patterned air gaps reduce the interconnect capacitance of the semiconductor device while leaving the dielectric layer with enough mechanical strength to serve as a middle-of-line dielectric.

20 Claims, 9 Drawing Sheets

(51) Int. Cl.
H01L 21/768 (2006.01)
H01L 21/265 (2006.01)
H01L 21/02 (2006.01)
H01L 21/3213 (2006.01)
H01L 21/324 (2006.01)
H01L 21/311 (2006.01)
H01L 23/522 (2006.01)
H01L 23/528 (2006.01)
H01L 23/532 (2006.01)
H01L 21/764 (2006.01)

(52) U.S. Cl.
CPC ........ *H01L 21/31* (2013.01); *H01L 21/31144* (2013.01); *H01L 21/324* (2013.01); *H01L 21/3213* (2013.01); *H01L 21/764* (2013.01); *H01L 21/7682* (2013.01); *H01L 21/76802* (2013.01); *H01L 21/76829* (2013.01); *H01L 21/76877* (2013.01); *H01L 21/76879* (2013.01); *H01L 23/528* (2013.01); *H01L 23/5226* (2013.01); *H01L 23/5329* (2013.01)

(58) Field of Classification Search
CPC ........... H01L 21/3213; H01L 21/76879; H01L 29/0649; H01L 21/31144; H01L 21/76829; H01L 23/5226; H01L 23/528; H01L 23/5329
See application file for complete search history.

(56) References Cited

U.S. PATENT DOCUMENTS

| | | | |
|---|---|---|---|
| 7,176,245 B2 | 2/2007 | Stucky et al. | |
| 7,785,937 B2 | 8/2010 | Kim et al. | |
| 7,923,276 B2 | 4/2011 | MacPherson et al. | |
| 8,217,518 B2 | 7/2012 | Tee et al. | |
| 8,486,824 B2 | 7/2013 | Tee et al. | |
| 8,633,112 B2 | 1/2014 | Millward et al. | |
| 8,940,623 B2 | 1/2015 | Gay et al. | |
| 8,999,492 B2 | 4/2015 | Millward et al. | |
| 9,013,008 B2 | 4/2015 | Li et al. | |
| 9,496,282 B2 | 11/2016 | Adam et al. | |
| 2002/0135071 A1* | 9/2002 | Kang | H01L 23/485 257/767 |
| 2005/0014328 A1* | 1/2005 | Graettinger | H01L 21/28518 438/202 |
| 2007/0293041 A1* | 12/2007 | Yang | H01L 21/0332 438/637 |
| 2008/0041818 A1* | 2/2008 | Kihara | B82Y 10/00 216/41 |
| 2008/0093743 A1* | 4/2008 | Yang | B81C 1/00095 257/758 |
| 2014/0144875 A1* | 5/2014 | Lim | G02B 5/3058 216/24 |
| 2015/0031210 A1* | 1/2015 | Ban | H01L 21/0337 438/703 |
| 2015/0041973 A1 | 2/2015 | Park et al. | |
| 2015/0214143 A1* | 7/2015 | Tsai | H01L 23/5329 257/773 |

OTHER PUBLICATIONS

L. Leibler, "Theory of Microphase Separation of Block Copolymers," Macromolecules,1980, pp. 1602-1617, vol. 13, American Chemical Society.

K.W. Guarini, "Low voltage, scalable nanocrystal FLASH memory fabricated by templated self-assembly," Electron Devices Meeting, IEDM Technical Digest, 2003, pp. 22.2.1-22.2.4, IEEE International.

P. Mokarian, "Directed Self-Assembly of Block Copolymers; an Alternative Tool for Sub-20 nm Lithography," Intel ERIC Conference, Oct. 2012, Croke Park, Dublin, Ireland.

A. Romo-Negreira et al., "Evaluation of integration schemes for contact-hole grapho-epitaxy DSA: A study of substrate and template affinity control," Alternative Lithographic Technologies VI, 2014, pp. 90491L-1 to 90491L-11, vol. 9049, Society of Photo-Optical Instrumentation Engineers.

J. Ruzyllo, "Semiconductor OneSource: Semiconductor Glossary—Search for : capping layer," 1 page, published on or before Apr. 15, 2012 at "http://www.semi1source.com/glossary/default.asp?searchterm=capping+layer," now available from Internet Archive Wayback Machine at "http://web.archive.org/web/20120515181214/http://www.semi1source.com/glossary/default.asp?searchterm=capping+layer".

J. Ruzyllo, "Semiconductor OneSource: Semiconductor Glossary—Search for : capping layer," 1 page, published on or before Jul. 4, 2016 at "http://www.semi1source.com/glossary/default.asp?searchterm=capping+layer," now available from Internet Archive Wayback Machine at "http://web.archive.org/web/20160704113012/http://www.semi1source.com/glossary/default.asp?searchterm=capping+layer".

S. Wolf et al., "Silicon Processing for the VLSI Era, vol. 1: Process Technology," Lattice Press, 660 pages, 1986.

S. Wolf, "Silicon Processing for the VLSI Era, vol. 4: Deep-Submicron Process Technology," Lattice Press, 822 pages, 2002.

* cited by examiner

METHOD OF FORMING DIELECTRIC WITH AIR GAPS FOR USE IN SEMICONDUCTOR DEVICES

BACKGROUND

The present invention relates to the electrical, electronic, and computer arts, and, more particularly, to methods for introducing air gaps into dielectric materials with metal contacts in semiconductor devices.

Dielectric materials in semiconductor devices must be of sufficient mechanical strength to withstand the many processing steps that go into forming these devices. These steps may include, for example, lithography, deposition, wet and dry etching, and chemical mechanical polishing (CMP). At the same time, many of these dielectric layers must be able to accommodate metal features that may be tensily or compressively stressed. Without sufficient mechanical strength, a dielectric layer may simply buckle or collapse.

While introducing air gaps into dielectric layers is an effective means for decreasing the dielectric constants of these layers and reducing interconnect capacitance, the air gaps also have the undesirable effect of reducing the mechanical strengths of the dielectric layers into which they are introduced. As a result, conventional dielectric materials that contain air gaps may not be suitable for many of the dielectric features in a given integrated circuit. Dielectric layers in the middle-of-line (MOL), which, in a planar MOSFET, overlie the source and drain diffusions and contain the diffusion contacts, may be good examples. The diffusion contacts in the MOL tend to be significantly smaller than the metal interconnects in the back-end-of-line (BEOL), and tend to come in a wide range of sizes and shapes (e.g., 1×1 vias, and 1×2 and 1×4 structures). As a result, these MOL metal features may not provide a lot of mechanical stability to the MOL dielectric, and more reliance must be placed on the mechanical stability of the MOL dielectric itself. The metal features in the MOL are also often formed of tungsten deposited by chemical vapor deposition (CVD), which tends to be tensile stressed. Accordingly, dielectric materials with air gaps are typically not well suited for use as MOL dielectrics because of the mechanical weaknesses induced by the presence of the air gaps.

SUMMARY

Embodiments of the invention provide a means for forming dielectric layers with air gaps for use in semiconductor devices. Advantageously, the air gaps are shaped and arranged so as to leave the remaining dielectric layers with substantial mechanical strength. This mechanical strength allows the dielectric layers to be used in demanding applications, for example, as MOL dielectrics.

Aspects of the invention are directed to a method for forming a semiconductor device. A dielectric layer is formed on a semiconductor substrate. Subsequently, a metallic contact is formed in the dielectric layer such that it lands on the semiconductor substrate. A masking layer comprising a block copolymer is then formed on the dielectric layer. This block copolymer is caused to separate into two phases. One of the two phases is next selectively removed to leave a patterned masking layer. The patterned masking layer is used to etch the dielectric layer.

Additional aspects of the invention are directed to a semiconductor device formed using the method set forth in the previous paragraph.

Lastly, even additional aspects of the invention are directed to a semiconductor device. A dielectric layer is disposed on a semiconductor substrate. A metallic layer is disposed in the dielectric layer and lands on the semiconductor substrate. Lastly, a plurality of cylindrical air gaps are disposed in the dielectric layer. The plurality of cylindrical air gaps are oriented substantially normal to a surface of the dielectric layer.

BRIEF DESCRIPTION OF THE SEVERAL VIEWS OF THE DRAWINGS

These and other features, aspects, and advantages of the present invention will become better understood with regard to the following description, appended claims, and accompanying drawings where:

In the sectional views included herein, features present behind the sectional planes are not shown to reduce clutter and enhance clarity.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As the term is used herein, "substantially" means within plus or minus ten percent. A first element "directly contacts" or "directly overlies" a second element when the first element contacts or overlies, respectively, the second element without any intermediate elements therebetween.

Figure 1A:
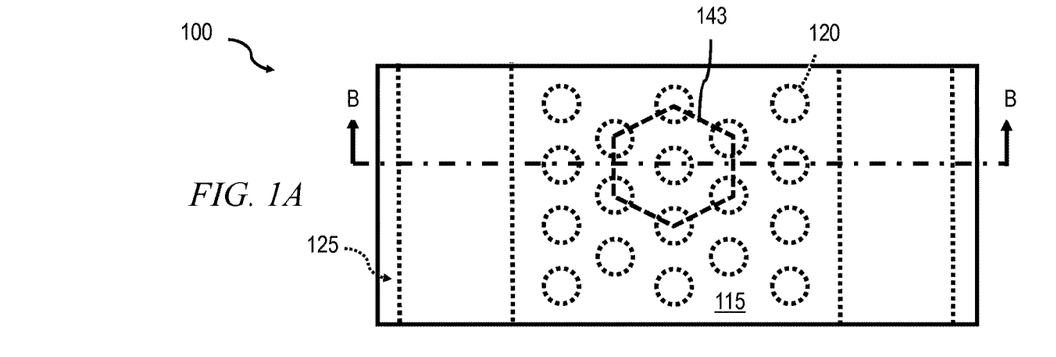
FIGS. 1A and 1B show a plan view and a sectional view, respectively, of a portion of a film stack, in accordance with an illustrative embodiment of the invention.
Figure 1B:
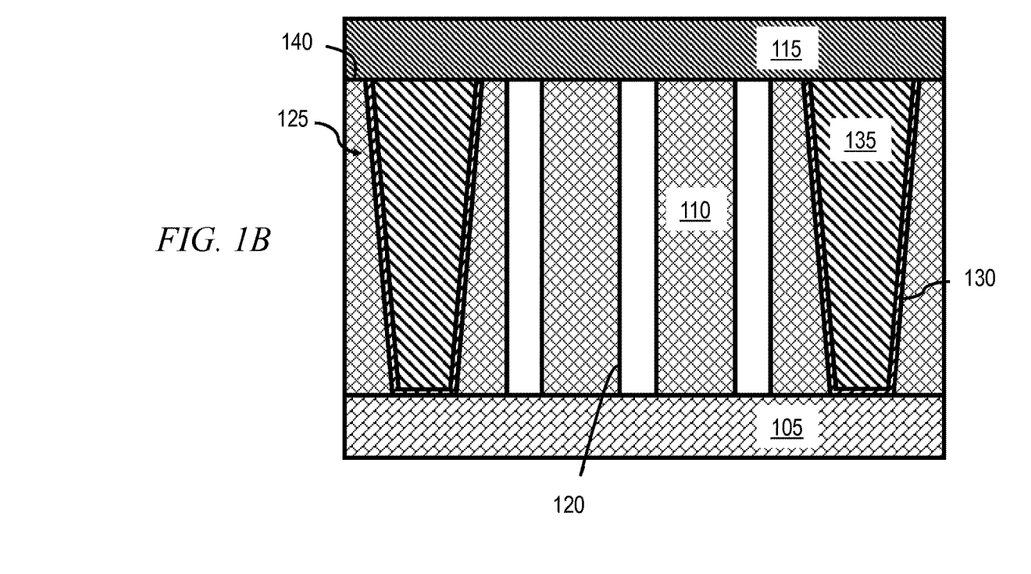

FIGS. 1A and 1B show a plan view and a sectional view, respectively, of a portion of a film stack 100, in accordance with an illustrative embodiment of the invention. The film stack 100 comprises a semiconductor substrate 105. A dielectric layer 110 is disposed on the semiconductor substrate 105 and is capped by a capping layer 115. The dielectric layer 110 defines a plurality of air gaps 120 therein. The dielectric layer 110 further encompasses two metallic contacts 125 that pass vertically through the dielectric layer 110 and land on the semiconductor substrate 105. Each of the metallic contacts 125 comprises a respective liner 130 and a respective core 135. Even though not directly visible, the positioning of the air gaps 120 and the metallic contacts 125 are shown by broken lines in the plan view in FIG. 1A.

In one or more embodiments, the semiconductor substrate 105 may comprise crystalline silicon, and the dielectric layer 110 and capping layer 115 may comprise silicon dioxide.

The liners 130 may comprise a combination of titanium and titanium nitride (hereinafter "Ti/TiN"), while the cores 135 may comprise tungsten.

While not limiting, it is contemplated that the film stack in FIGS. 1A and 1B may constitute a portion of the MOL region of a complementary metal-oxide-semiconductor (CMOS) integrated circuit. Accordingly, the semiconductor substrate 105 may include source and drain diffusions, and the dielectric layer 110 may constitute the MOL dielectric. The metallic contacts 125 may contact the source and drain diffusions in the semiconductor substrate 105, making these metallic contacts "diffusion contacts" or "CA contacts." Gate features, not visible, would also be incorporated into this MOL region and at least partially surrounded by the dielectric layer 110.

Each of the air gaps 120 in the dielectric layer 110 is shaped as an open cylinder that is oriented substantially normal to an uppermost surface 140 of the dielectric layer 110. Viewed from above, the cylindrical air gaps 120 are arranged in a hexagonal, honeycomb pattern relative to one another (i.e., the cylindrical air gaps 120 are arranged on the nodes of a hexagonal lattice, as illustrated by the dashed hexagonal shape 143 in FIG. 1A). Advantageously, the air gaps 120 instill the dielectric layer 110 with an decreased effective dielectric constant. At the same time, the cylindrical shape and regular hexagonal arrangement of the air gaps 120 leaves the remaining dielectric layer 110 with a skeleton that is mechanically robust. The dielectric layer 110 with the air gaps 120 is strong enough to survive subsequent processing steps, such as lithography, deposition, dry and wet etching, and CMP without buckling or collapsing. The dielectric layer 110 is therefore a suitable candidate for demanding applications, including for use as a MOL dielectric as set forth herein.

Figure 2:
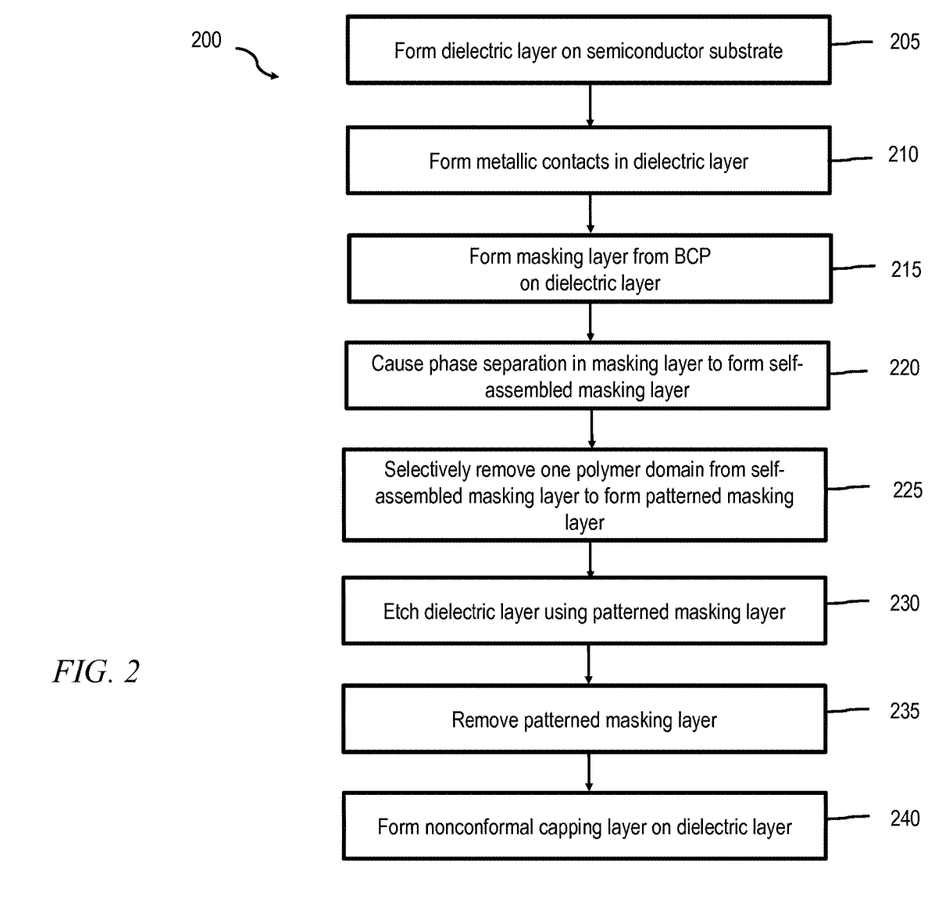
FIG. 2 shows a flow diagram of an illustrative method for forming the film stack in FIGS. 1A and 1B.

FIG. 2 shows a flow diagram of an illustrative method 200 for forming the film stack 100 in FIGS. 1A and 1B. FIGS. 3A-8B show plan and sectional views of intermediate film stacks formed while performing the method, where the "A" figures show plan views, and the "B" figures show corresponding sectional views. Although the method 200 and the structures formed thereby are entirely novel, many of the individual processing steps required to implement the method 200 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

Figure 3A:
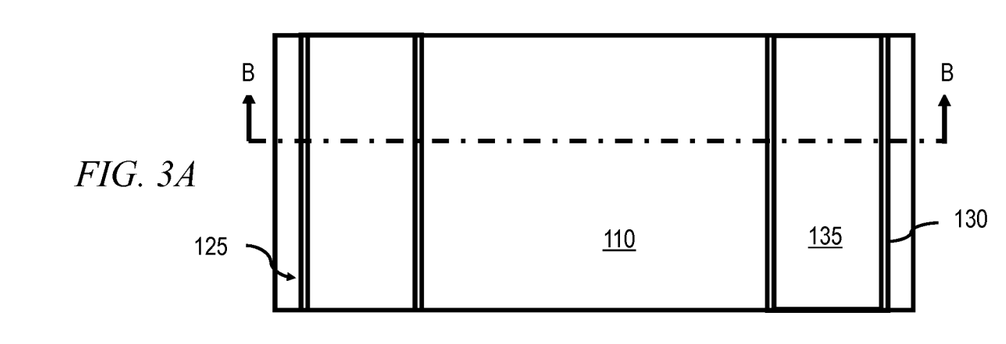
FIGS. 3A-3B, 4A-4B, 5A-5B, 6A-6B, 7A-7B and 8A-8B show plan and sectional views of intermediate film stacks formed while performing the FIG. 2 method, where the "A" figures show plan views, and the "B" figures show sectional views.
Figure 3B:
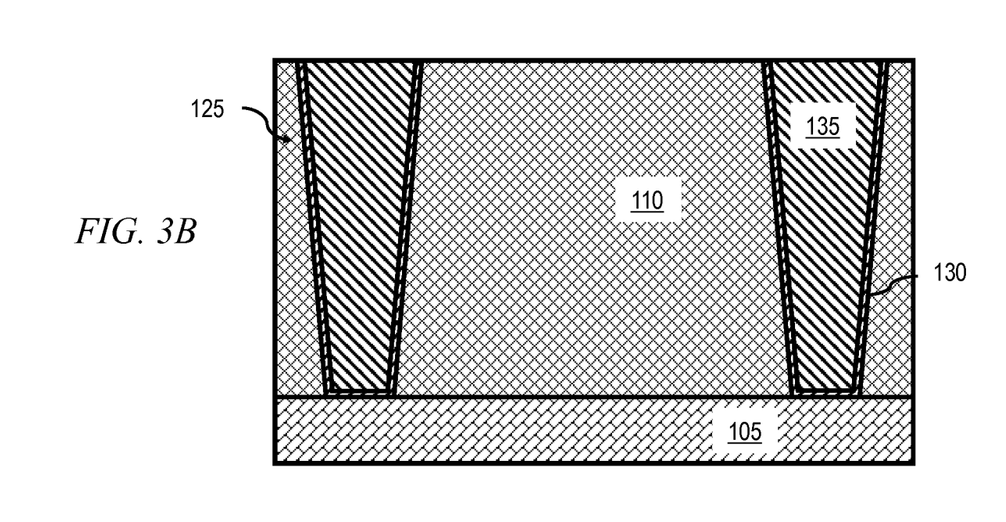

The method starts in steps 205 and 210 with the forming of the dielectric layer 110 on a semiconductor substrate 105 (step 205) and the forming of the metallic contacts 125 (step 210) in the dielectric layer 110 to yield the film stack shown in FIGS. 3A and 3B. If the dielectric layer 110 comprises silicon dioxide, that silicon dioxide may be deposited utilizing conventional CVD with, for example, tetraethylorthosilicate (TEOS). Formation of the metallic contacts 125 may occur by what is frequently called a "damascene" process, namely, by utilizing photolithography and reactive ion etching (RIE) to pattern contact openings in the dielectric layer 110, depositing liner material and the core material to the point that they fill the contact openings, and then utilizing CMP to remove excess metallic material from the top of the dielectric layer 110. Ti/TiN liners 130 and tungsten cores 135 may be deposited by conventional CVD. The liners 130 act as diffusion barriers and to enhance adhesion of the cores 135.

Figure 4A:
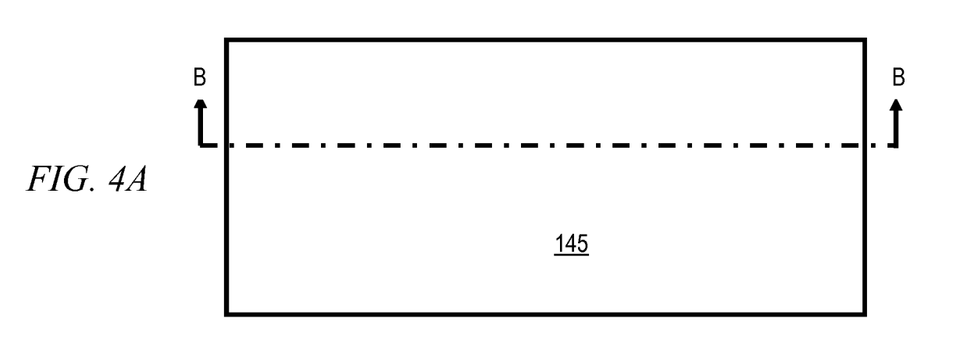
Figure 4B:
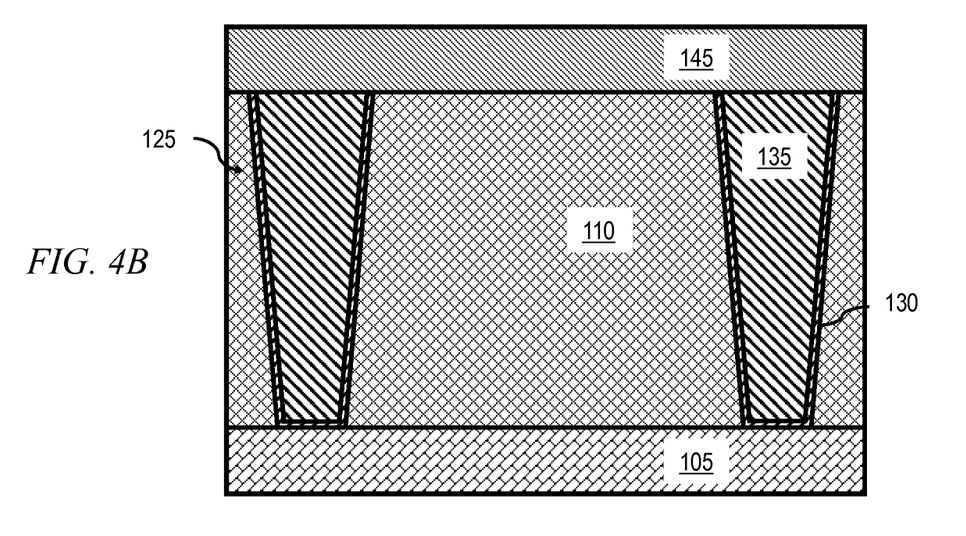

Step 215 involves forming a masking layer 145 on the dielectric layer 110 and the tops of the metallic contacts 125 to yield the film stack shown in FIGS. 4A and 4B. In accordance with aspects of the invention, the masking layer 145 comprises a block copolymer (BCP). The BCP may be deposited by conventional spin coating as a diluted polymer solution in the manner of a photoresist. BCPs contain two blocks of mutually-repulsive polymers joined by a covalent bond. When the polymers are allowed to move, the different blocks will naturally self-assemble into distinct phases based on the composition and volume fractions of the polymer constituents. By heating a BCP past its glass transition temperature, the polymer chains become mobile and rearrange towards an equilibrium structure. Equilibrium structures include spheres, cylinders, gyroids, diamonds, and lamellae (i.e., thin, plate-like structures).

In the present non-limiting embodiment, the BCP preferably comprises polystyrene (PS) covalently bonded to poly (methyl methacrylate) (PMMA) to form what may be called a PS-b-PMMA BCP. Nevertheless, alternative embodiments may utilize different BCPs such as, but not limited to, PS and 4-(tert-butyldimethylsilyl)oxy styrene (PS-b-PSSi), PS and dimethylsiloxane (PS-b-PDMS), and PS and vinylpyrrolidone (PS-b-PVP). For purposes of this illustrative embodiment, the volume fraction of PS to PMMA is preferably such that the PS-b-PMMA segregates into PMMA cylinders when annealed (i.e., the PS-b-PMMA is cylinder forming). This BCP may be further tuned to give the desired cylinder diameters and spacings. Research with PS-b-PMMA has shown, for example, that the diameter of cylindrical domains can be selected to be 14-50 nm, depending on the molecular weight of the BCP. Addition of PS and PMMA homopolymer to the PS-b-PMMA to form a blend can also affect the diameter of the cylinders, resulting in diameters and domain spacings that are anywhere from 10% smaller to 150% larger than the corresponding values of pure PS-b-PMMA. This latter effect depends on the relative amount and molecular weight of the homopolymers added to the BCP.

Figure 5A:
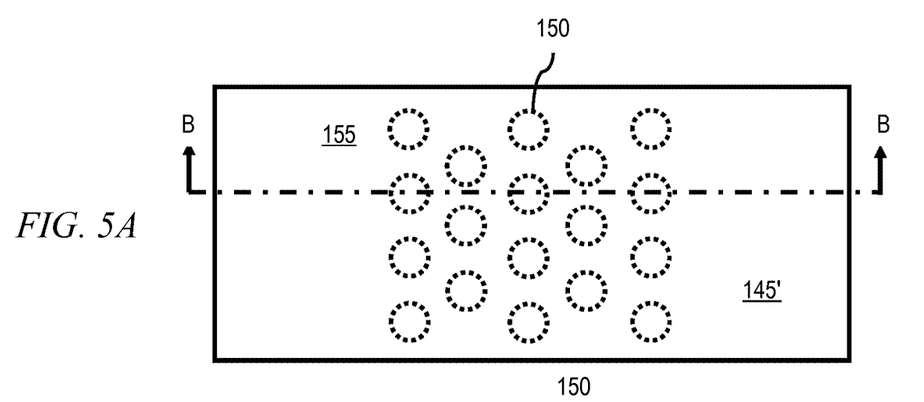
Figure 5B:
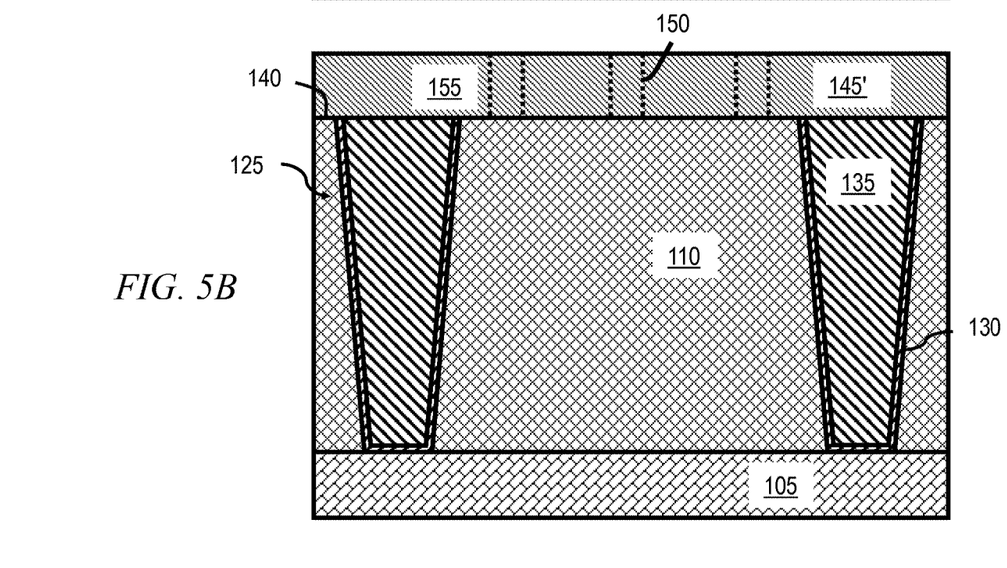

Step 220 includes the step of causing the BCP in the masking layer 145 to separate into two phases (cylindrical polymer domains 150 and a surrounding polymer domain 155) to yield the film stack shown in FIGS. 5A and 5B. The self-assembled masking layer is now labelled by reference numeral 145'. In the present embodiment, this self-assembly may be accomplished by annealing the material above its glass transition temperature (e.g., about 200-300° C.). As indicated in FIGS. 5A and 5B, the cylindrical polymer domains 150 (comprising PMMA) of the self-assembled masking layer 145' are oriented substantially normal to the uppermost surface 140 of the dielectric layer 110. They are arranged hexagonally relative to one another. FIGS. 5A and 5B do not show self-assembly of the masking layer 145' over the metallic contacts 125 because of the effect of the metallic contacts' upper surfaces on the BCP material. Nevertheless, if self-assembly were to occur on the metallic contacts 125, that self-assembly is ultimately immaterial so long as the etching step in step 230 (set forth below) does not substantially etch the metallic contacts 125.

Figure 6A:
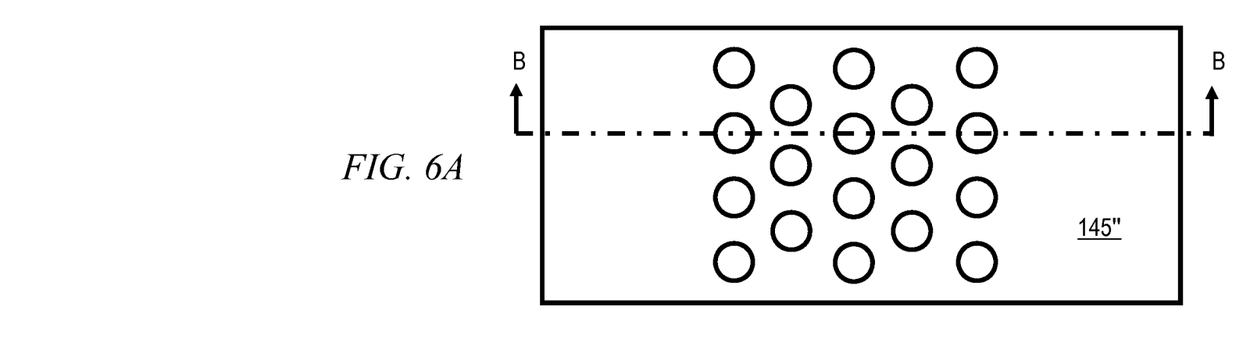
Figure 6B:
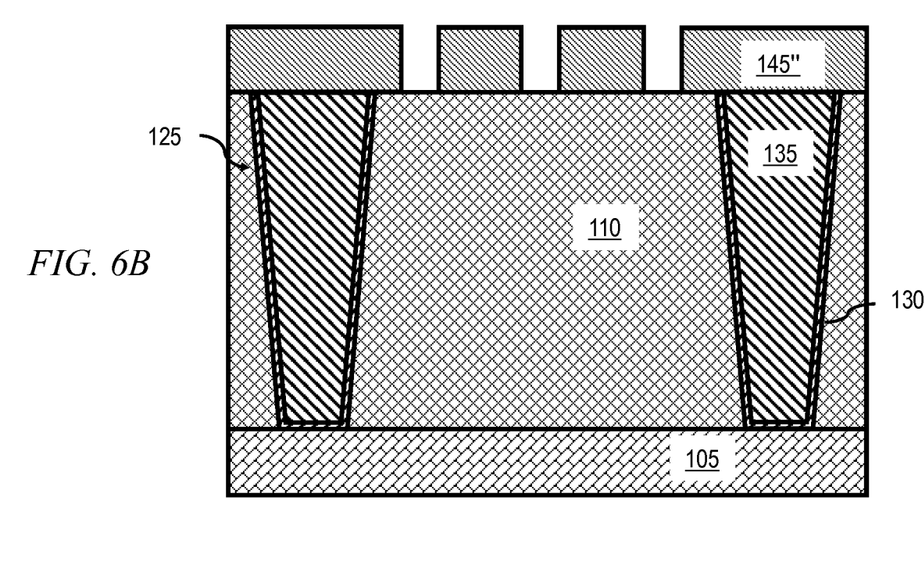

Step 225 causes the cylindrical polymer domains 150 to be etched away to leave only the surrounding polymer domain 155 in the manner shown in FIGS. 6A and 6B. The resultant patterned masking layer is now labelled by reference numeral 145". PMMA tends to be more reactive with oxygen than PS. Accordingly, exposing the film stack in FIGS. 5A and 5B to an oxygen plasma is an effective way of selectively removing the cylindrical polymer domains 150 while leaving the surrounding polymer domain 155 in place. Alternative techniques may include exposing the film stack to a solvent such as one comprising an organic reagent like acetic acid. In either case, the film stack in FIGS. 5A and 5B may be exposed to UV light before etching to make the PMMA even more susceptible to the etchant in relation to the PS. UV light tends to de-crosslink PMMA (i.e., cause scission in the PMMA) in the manner of a positive UV photoresist.

Figure 7A:
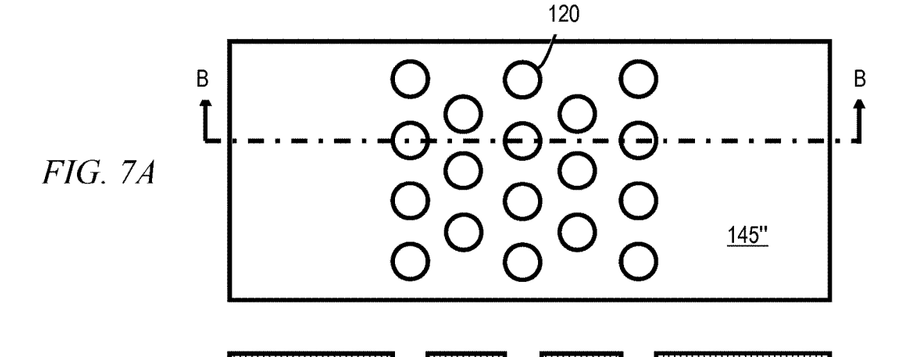
Figure 7B:
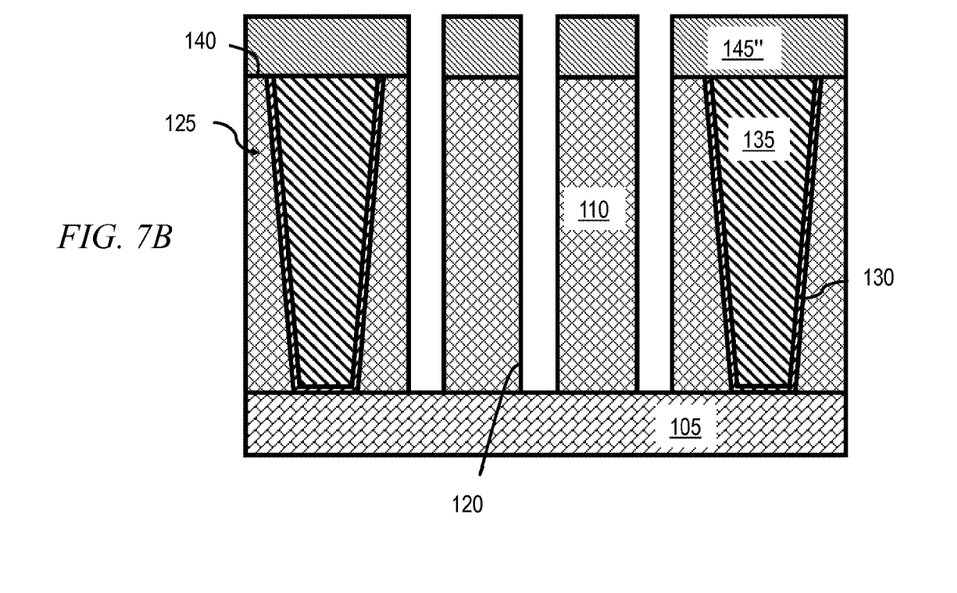

Step 230 involves using the patterned masking layer 145" as a mask to etch the underlying dielectric layer 110. The resultant film stack is shown in FIGS. 7A and 7B. This etching step may be performed by anisotropic RIE selective to the underlying semiconductor substrate (e.g., crystalline silicon) and the metallic contacts 125 if they are exposed. For example, the RIE may utilize $CF_4$ with $O_2$ or $H_2$; $CHF_3$; or $SiCl_4$ as reactants. After etching, the dielectric layer 110 comprises the cylindrical air gaps 120 that span from the uppermost surface 140 of the dielectric layer 110 to the semiconductor substrate 105. The cylindrical air gaps 120 are oriented substantially perpendicular to the uppermost surface 140 of the dielectric layer 110.

Figure 8A:
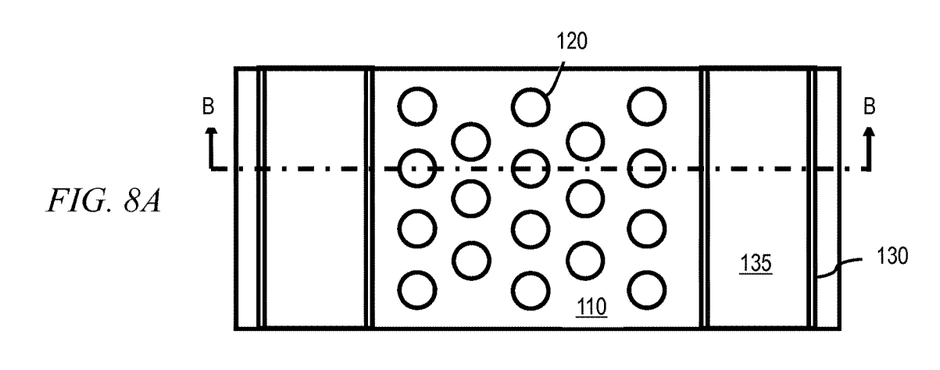
Figure 8B:
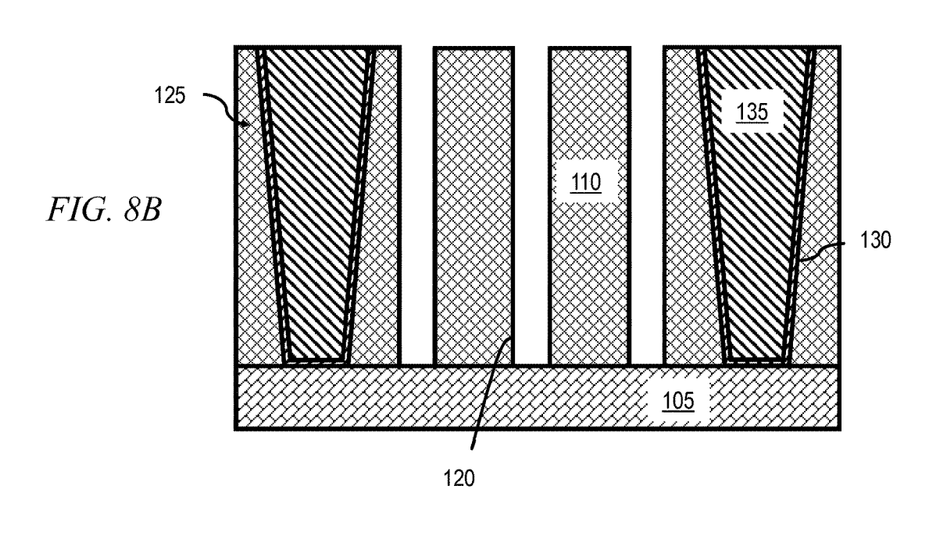

Step 235 involves the removal of the patterned masking layer 145". Here, a wet etch may be utilized, again utilizing an organic solvent. A suitable solvent may comprise, for example, toluene. The resultant film stack is shown in FIGS. 8A and 8B. Finally, step 245 involves forming the capping layer 115 on the film stack in FIGS. 8A and 8B to yield the film stack initially shown in FIGS. 1A and 1B. If the capping layer 115 comprises silicon dioxide, the formation of the capping layer may be by atmospheric pressure CVD with silane and oxygen, which tends to form in a nonconformal, reentrant manner at the tops of small trench features. So formed, the capping layer 115 pinches off the air gaps 120 without substantially filling them in. With the capping layer in place additional processing may be performed on the film stack 100 to convert it into working devices.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention.

Figure 9A:
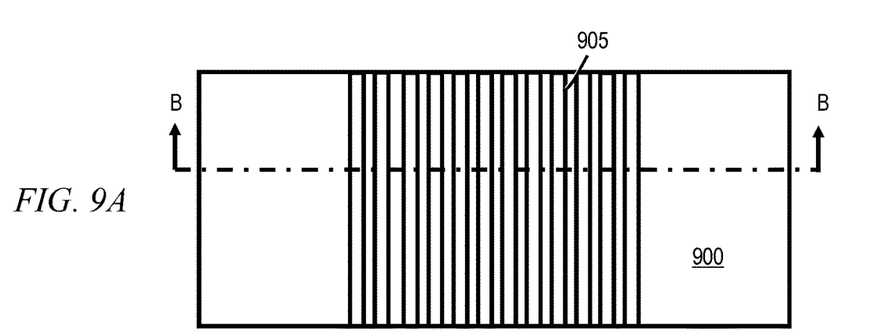
FIGS. 9A and 9B show a plan view and a sectional view, respectively, of a portion of an intermediate film stack, in accordance with an alternative illustrative embodiment of the invention.
Figure 9B:
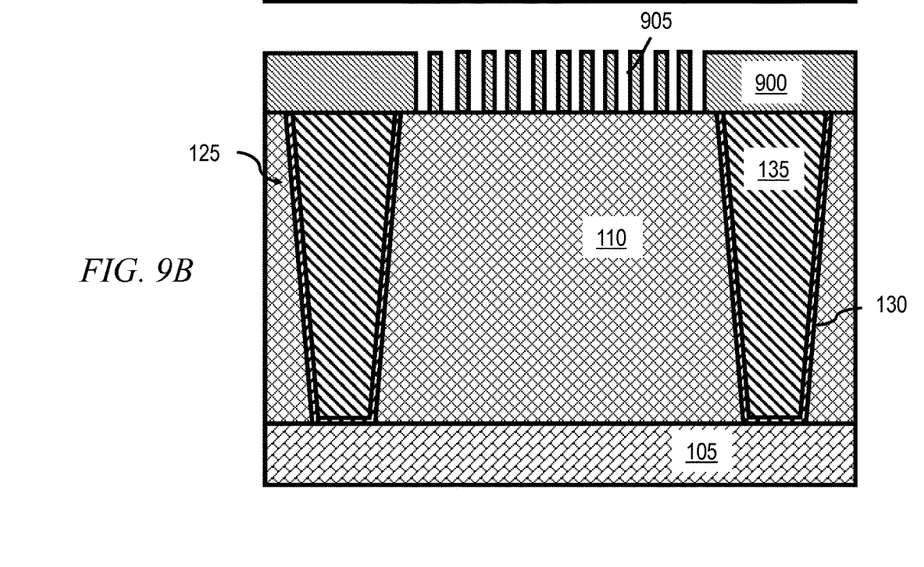

As just one example, while the above-described embodiment had the BCP of the masking layer 145 be tuned to form cylindrical polymer domains upon self-assembly, the composition of the BCP may instead be tuned to segregate into lamellae. Such tuning may be accomplished by, for example, modifying the relative volume fractions of the two block copolymers and/or by choosing block copolymers with suitable interaction parameters, both of which influence the phase diagram for the chosen BCP. Processing according to the method 200 would, in turn, yield the film stack shown in FIGS. 9A and 9B after performing step 225 on the self-assembled masking layer (i.e., selectively removing one polymer domain from the self-assembled masking layer to form a patterned masking layer). In FIGS. 9A and 9B, a patterned masking layer 900 includes a series of narrow linear trenches 905. In subsequent processing, these linear trenches 905 are transferred into the underlying dielectric layer 110. Thus rather than having a plurality of cylindrical air gaps, the resultant dielectric layer 110 would instead have a series of closely spaced linear air gap trenches.

At least a portion of the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming a semiconductor device, the method comprising the steps of:
    forming a dielectric layer directly on a semiconductor substrate;
    forming a metallic contact in the dielectric layer that lands on the semiconductor substrate, the metallic contact directly contacting the semiconductor substrate;
    forming a masking layer comprising a block copolymer on the dielectric layer;
    causing the block copolymer to separate into two phases;
    selectively removing one of the two phases to leave a patterned masking layer; and
    using the patterned masking layer as a mask to etch the dielectric layer.

2. The method of claim 1, wherein the step of forming the dielectric layer comprises chemical vapor deposition.

3. The method of claim 1, wherein the masking layer comprises polystyrene bonded to 4-(tert-butyldimethylsilyl) oxy styrene.

4. The method of claim 1, wherein one of the two phases defines a plurality of cylinders in the masking layer.

5. The method of claim 4, wherein six of the plurality of cylinders are arranged on nodes of a hexagonal lattice.

6. The method of claim 4, wherein using the patterned masking layer as a mask to etch the dielectric layer defines a plurality of cylindrical air gaps within the dielectric layer corresponding to the plurality of cylinders defined in the patterned masking layer.

7. The method of claim 6, wherein the plurality of air gaps span from a surface of the dielectric layer to the semiconductor substrate.

8. The method of claim 6, further comprising the step of capping the dielectric layer with a capping layer, wherein the capping layer pinches off but does not substantially fill in the plurality of air gaps.

9. The method of claim 1, wherein one of the two phases defines a plurality of plates in the masking layer.

10. The method of claim 9, wherein the masking layer comprises a series of narrow linear trenches, and further comprising the step of transferring the series of narrow linear trenches into the dielectric layer so as to define a corresponding series of closely spaced linear air trenches.

11. The method of claim 1, wherein the step of using the patterned masking layer as a mask to etch the dielectric layer comprises anisotropic reactive ion etching.

12. The method of claim 11, wherein the anisotropic reactive ion etching is selective to at least one of the semiconductor substrate and the metallic contact.

13. The method of claim 1, further comprising the steps of removing the patterned masking layer followed by capping the dielectric layer with a capping layer.

14. The method of claim 1, further comprising the step of capping the dielectric layer with a capping layer.

15. The method of claim 7, wherein the capping layer directly overlies the dielectric layer.

16. The method of claim 1, wherein the metallic contact comprises:
 a liner within and directly overlying the contact opening; and
 a core directly overlying the liner within the contact opening.

17. The method of claim 16, wherein:
 the core comprises tungsten; and
 the liner comprises titanium and titanium nitride.

18. The method of claim 1, wherein one of the two phases defines a plurality of equilibrium structures in the masking layer, the equilibrium structures comprising at least one of:
 one or more spheres,
 one or more gyroids, and
 one or more diamonds.

19. A method for forming a semiconductor device, the method comprising the steps of:
 forming a dielectric layer on a semiconductor substrate, wherein the dielectric layer directly overlies the semiconductor substrate;
 forming a metallic contact in the dielectric layer that lands on the semiconductor substrate, wherein the metallic contact directly contacts the semiconductor substrate;
 forming a masking layer comprising a block copolymer on the dielectric layer, wherein the masking layer directly overlies the dielectric layer;
 causing the block copolymer to separate into two phases;
 selectively removing one of the two phases to leave a patterned masking layer; and
 using the patterned masking layer as a mask to etch the dielectric layer.

20. A method for forming a semiconductor device, the method comprising the steps of:
 forming a dielectric layer on a semiconductor substrate;
 forming a metallic contact in the dielectric layer that lands on the semiconductor substrate;
 forming a masking layer comprising a block copolymer on the dielectric layer;
 causing the block copolymer to separate into two phases;
 selectively removing one of the two phases to leave a patterned masking layer;
 using the patterned masking layer as a mask to etch the dielectric layer; and
 capping the dielectric layer with a capping layer;
 wherein the dielectric layer and the capping layer each comprises silicon dioxide;
 wherein the step of forming the dielectric layer comprises chemical vapor deposition with tetraethhylorthosilicate; and
 wherein the step of capping the dielectric layer with the capping layer comprises chemical vapor deposition with silane and oxygen.

* * * * *